(12) United States Patent
Lee et al.

(10) Patent No.: US 10,535,746 B2
(45) Date of Patent: Jan. 14, 2020

(54) METAL GATE STRUCTURE AND METHODS THEREOF

(71) Applicant: Taiwan Semiconductor Manufacturing Co., Ltd., Hsinchu (TW)

(72) Inventors: Tzung-Chi Lee, Taipei County (TW); Tung-Heng Hsieh, Hsinchu County (TW); Bao-Ru Young, Hsinchu County (TW); Chia-Sheng Fan, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/044,227

(22) Filed: Jul. 24, 2018

(65) Prior Publication Data

US 2018/0331199 A1 Nov. 15, 2018

Related U.S. Application Data

(62) Division of application No. 15/649,865, filed on Jul. 14, 2017, now Pat. No. 10,079,289.
(Continued)

(51) Int. Cl.
*H01L 29/49* (2006.01)
*H01L 21/8238* (2006.01)
(Continued)

(52) U.S. Cl.
CPC .. *H01L 29/4966* (2013.01); *H01L 21/823437* (2013.01); *H01L 21/823821* (2013.01);
(Continued)

(58) Field of Classification Search
CPC ............. H01L 29/4966; H01L 29/4958; H01L 29/517; H01L 29/665; H01L 29/6653;
(Continued)

(56) References Cited

U.S. PATENT DOCUMENTS

| 7,667,271 B2 | 2/2010 | Yu et al. |
| 7,910,453 B2 | 3/2011 | Xu et al. |

(Continued)

FOREIGN PATENT DOCUMENTS

| KR | 20160094244 | 8/2016 |
| KR | 10-2016-0140319 | 12/2016 |

(Continued)

*Primary Examiner* — Tu-Tu V Ho
(74) *Attorney, Agent, or Firm* — Haynes and Boone, LLP

(57) ABSTRACT

Provided is a metal gate structure and related methods that include forming a first fin and a second fin on a substrate. In various embodiments, the first fin has a first gate region and the second fin has a second gate region. By way of example, a metal-gate line is formed over the first and second gate regions. In some embodiments, the metal-gate line extends from the first fin to the second fin, and the metal-gate line includes a sacrificial metal portion. In various examples, a line-cut process is performed to separate the metal-gate line into a first metal gate line and a second gate line. In some embodiments, the sacrificial metal portion prevents lateral etching of a dielectric layer during the line-cut process.

20 Claims, 11 Drawing Sheets

Related U.S. Application Data

(60) Provisional application No. 62/438,398, filed on Dec. 22, 2016.

(51) Int. Cl.
*H01L 21/8234* (2006.01)
*H01L 29/51* (2006.01)
*H01L 21/84* (2006.01)
*H01L 29/66* (2006.01)

(52) U.S. Cl.
CPC .... *H01L 21/823842* (2013.01); *H01L 21/845* (2013.01); *H01L 29/4958* (2013.01); *H01L 29/517* (2013.01); *H01L 29/665* (2013.01); *H01L 29/6653* (2013.01); *H01L 29/66795* (2013.01)

(58) Field of Classification Search
CPC ..... H01L 21/823437; H01L 21/823821; H01L 21/823842; H01L 21/845
USPC ........................................................ 257/369
See application file for complete search history.

(56) References Cited

U.S. PATENT DOCUMENTS

| | | | |
|---|---|---|---|
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,224,865 B2 | 12/2015 | Akarvardar et al. | |
| 9,331,074 B1 | 5/2016 | Chang et al. | |
| 9,627,375 B2 | 4/2017 | Chang et al. | |
| 9,859,273 B2 | 1/2018 | Chen et al. | |
| 1,009,659 A1 | 10/2018 | Tsai et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2016/0225764 A1* | 8/2016 | Chang | H01L 27/0886 |
| 2017/0148682 A1* | 5/2017 | Basker | H01L 21/823431 |

FOREIGN PATENT DOCUMENTS

| | | |
|---|---|---|
| TW | 201334158 | 8/2013 |
| TW | 201543575 | 11/2015 |

* cited by examiner

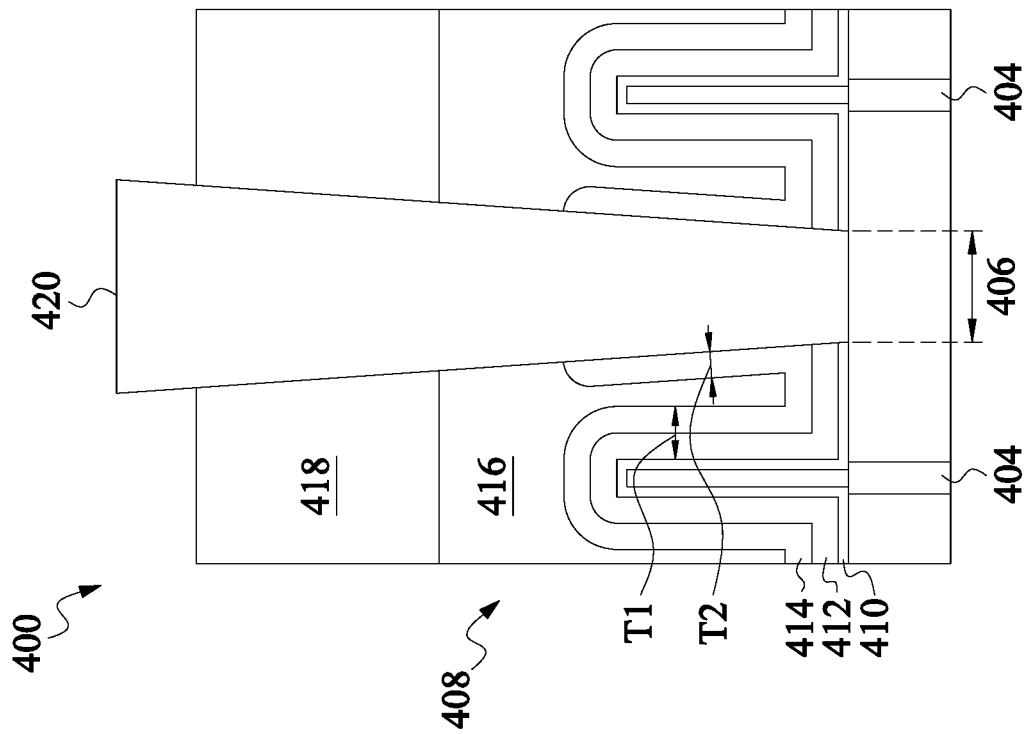
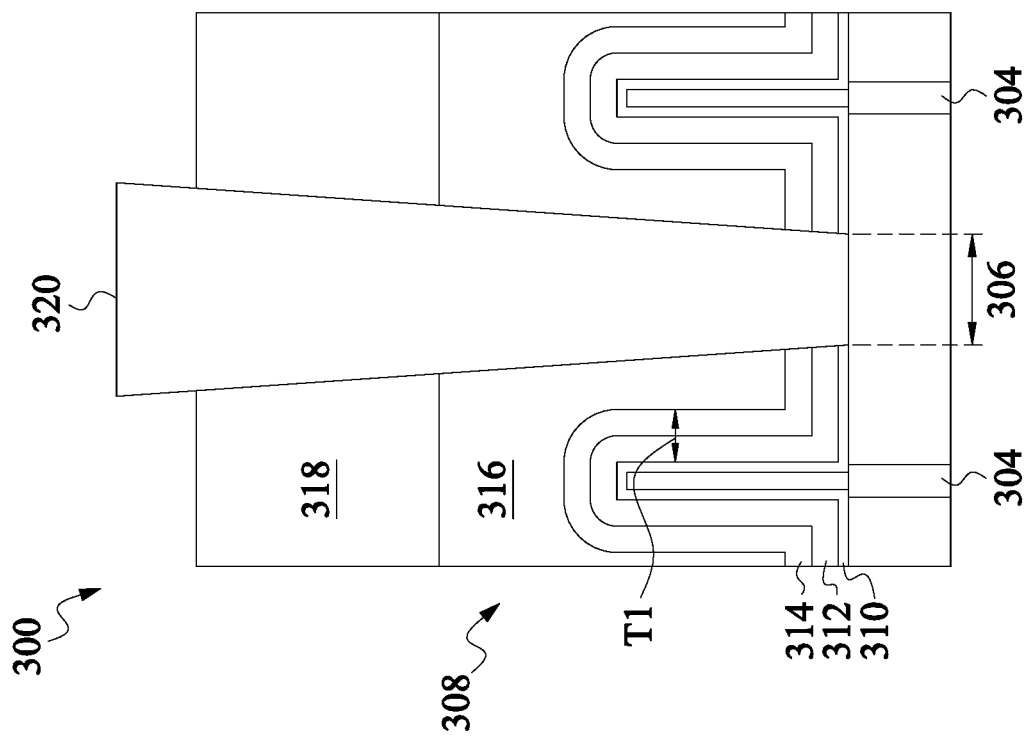

METAL GATE STRUCTURE AND METHODS THEREOF

CROSS-REFERENCE TO RELATED APPLICATIONS

This application is a divisional application of U.S. patent application Ser. No. 15/649,865, filed Jul. 14, 2017, which claims the benefit of U.S. Provisional Application No. 62/438,398, filed Dec. 22, 2016, the entire disclosures of which are incorporated by reference herein.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In addition, metal gate electrodes have been introduced as a replacement to polysilicon gate electrodes. Metal gate electrodes provide a number of advantages over polysilicon gate electrodes such as avoidance of the polysilicon depletion effect, work-function tuning by selection of appropriate gate metal(s), as well as other benefits. By way of example, a metal gate electrode fabrication process may include a metal layer deposition followed by a subsequent metal layer cut process. In some cases, the metal layer cut process may result in loss of portions of an inter-layer dielectric (ILD), leading to degraded device reliability.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a cross-section view of a FinFET structure, in which a metal gate line-cut process is performed, in accordance with at least some existing processes;

FIG. 4 illustrates a cross-section view of a FinFET structure, in which a metal gate line-cut process is performed, in accordance with embodiments of the present disclosure;

DETAILED DESCRIPTION

Figure 1:
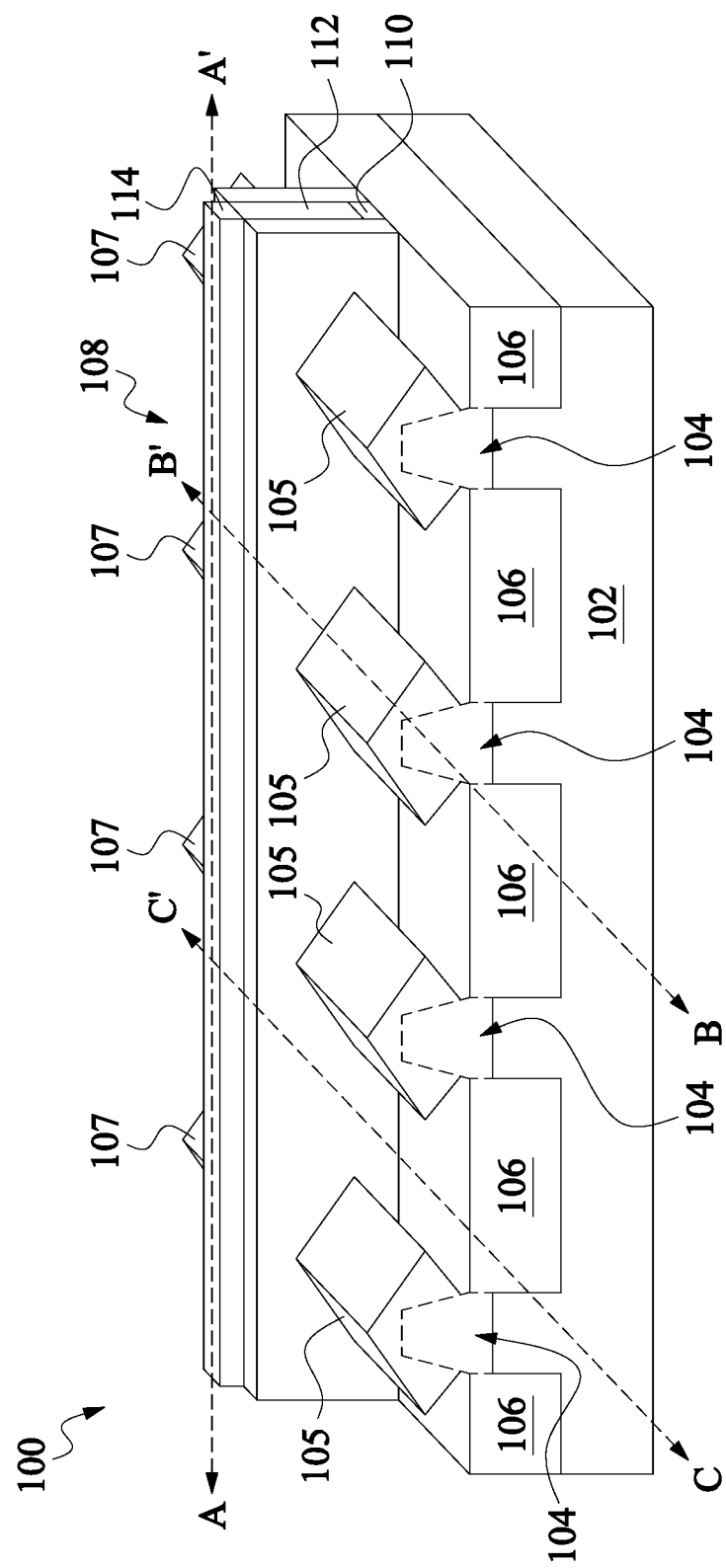
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (π-gate) devices.

The present application is generally related to a metal gate structure and related methods. In particular, the present disclosure is directed to a metal gate cut process and related structure. Metal gate electrodes have been introduced as a replacement to polysilicon gate electrodes. Metal gate electrodes provide a number of advantages over polysilicon gate electrodes such as avoidance of the polysilicon depletion effect, work-function tuning by selection of appropriate gate metal(s), as well as other benefits. By way of example, a metal gate electrode fabrication process may include a metal layer deposition followed by a subsequent metal layer cut process. In some cases, the metal layer cut process may result in loss of portions of an inter-layer dielectric (ILD), leading to degraded device reliability.

Embodiments of the present disclosure offer advantages over the existing art, though it is understood that other embodiments may offer different advantages, not all advantages are necessarily discussed herein, and no particular advantage is required for all embodiments. Generally, and in accordance with embodiments disclosed herein, a metal gate cut process and related structure are provided. At least some embodiments of the present disclosure may be used to reduce inter-layer dielectric (ILD) loss during a metal gate cut process. For example, in at least some existing processes, over-etching of a metal gate layer (e.g., during a metal gate cut process) may lead to such undesirable ILD loss). To mitigate this issue, embodiments of the present disclosure provide a metal gate layer, or multiple layers, having different thicknesses on a fin (e.g., FinFET) and on a neighboring line-cut region. Moreover, in at least some embodiments, a sacrificial metal portion may be used to prevent lateral etching during a metal line cut process, thereby effectively preventing ILD loss.

Illustrated in FIG. 1 is a FinFET device 100. Various embodiments disclosed herein may be used to fabricate the FinFET device 100 and/or may be present in the final structure of the FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include a silicon-on-insulator (SOI) structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an extreme ultraviolet (EUV) lithography process or an electron beam (e-beam) lithography process. The masking element may then be used to protect regions of the substrate while an etch process forms recesses into the silicon layer, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. A channel region of a transistor is disposed within the fin 104, underlying the gate structure 108, along a plane substantially parallel to a plane defined by section BB' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300 K) of around 1350 $cm^2$/V-s and a hole mobility of around 480 $cm^2$/V-s.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack having an interfacial layer 110 formed over the channel region of the fin 104, a gate dielectric layer 112 formed over the interfacial layer 110, and a metal layer 114 formed over the gate dielectric layer 112. The interfacial layer 110 may include a dielectric material such as silicon oxide layer ($SiO_2$) or silicon oxynitride (SiON). The interfacial layer 110 may be formed by chemical oxidation, thermal oxidation, atomic layer deposition (ALD), chemical vapor deposition (CVD), and/or other suitable method. The gate dielectric layer 112 may include a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, combinations thereof, or other suitable material. In still other embodiments, the gate dielectric layer may include silicon dioxide or other suitable dielectric. The dielectric layer may be formed by ALD, physical vapor deposition (PVD), oxidation, and/or other suitable methods. The metal layer 114 may include a conductive layer such as W, TiN, TaN, WN, Re, Ir, Ru, Mo, Al, Co, Ni, combinations thereof, and/or other suitable compositions. In some embodiments, the metal layer 114 may include a first metal material for N-type FinFETs and a second metal material for P-type FinFETs. Thus the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 114 may provide a gate electrode for the FinFET device 100, including both N-type and P-type FinFET devices 100. In some embodiments, the metal layer 114 may alternately include a polysilicon layer. The metal layer 114 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof.

Figure 2:
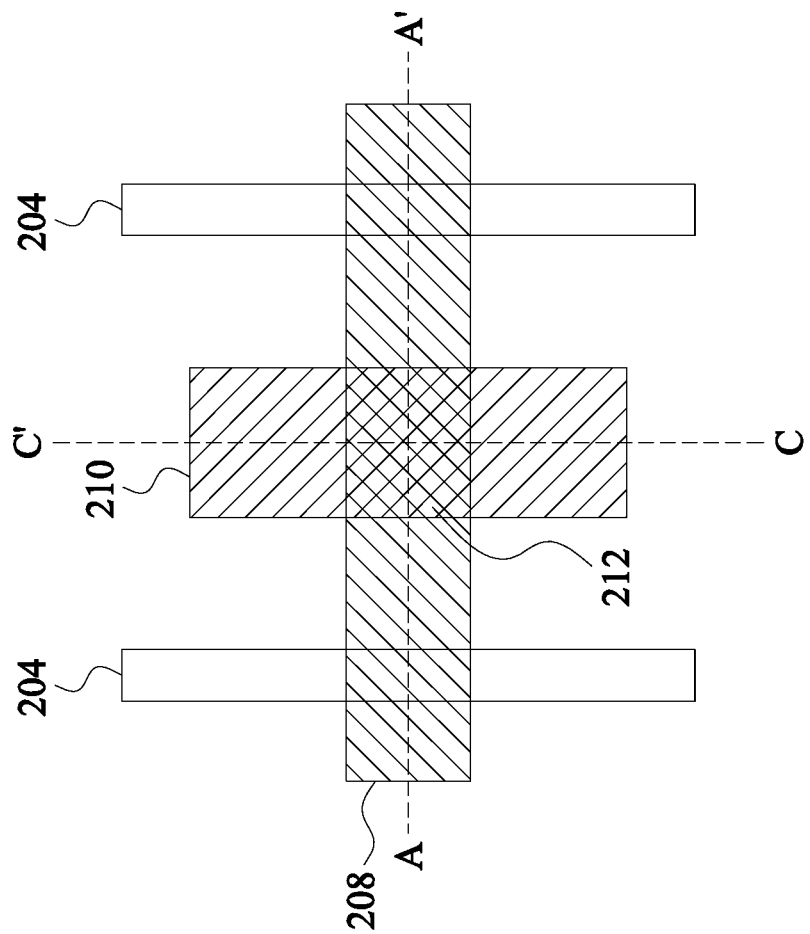
FIG. 2 is a top-view of neighboring fins, a metal gate structure, and a metal gate cut pattern, in accordance with some embodiments.

Referring now to FIG. 2, illustrated therein is a top-view of neighboring fins 204 and a metal gate structure 208 disposed over and substantially perpendicular to the fins 204. In some embodiments, section AA' of FIG. 2 may be substantially parallel to the plane defined by section AA' of FIG. 1, and section CC' of FIG. 2 may be substantially parallel to the plane defined by section CC' of FIG. 1. In some cases, the fins 204 may be substantially the same as fins 104 described above, and the metal gate structure 208 may be similar in at least some aspects to the gate structure 108 described above. By way of example, FIG. 2 also shows a metal gate cut pattern 210, which in some examples may be defined by a patterned hard mask layer. In some embodiments, the metal gate cut pattern 210 provides an opening (e.g., in the patterned hard mask layer) through which a metal gate line-cut process is performed and in which a portion 212 of a metal gate layer of the metal gate structure 208 may be cut. A metal gate line-cut process, as described herein, may include a dry etch process, a wet etch process, or a combination thereof, which is used to remove a portion of the metal gate layer of the metal gate structure 208 within an area defined by the metal gate cut pattern 210. By way of example, the metal gate line-cut process may be used to cut a metal gate line into separate, electrically disconnected lines. In some embodiments, a dielectric layer may be formed within a line-cut region (e.g., where the portion of the metal gate layer has been removed) as part of the metal gate line-cut process.

With reference to FIG. 3, illustrated therein is a cross-section view of a FinFET structure 300, along a plane substantially parallel to a plane defined by section AA' of FIG. 1, in which a metal gate line-cut process is performed, in accordance with at least some existing processes. The FinFET structure 300 may include one or more of the features described above with reference to the FIG. 1 such as fin elements 304 extending from a substrate, isolation regions 306, and a gate structure 308 disposed on and around the fin-elements 304. The gate structure 308 may include a gate stack having a dielectric layer 310, including an interfacial layer and a gate dielectric layer, and a metal layer formed over the dielectric layer 310. In some examples, the metal layer may include a first metal material 312 (e.g., such as a P-type work function metal (PWFM)), a second metal material 314 (e.g., such as an N-type work function metal (NWFM)) over the first metal material 312, and a third metal material 316 (e.g., such as tungsten) over the second metal material 314. In various examples, a dielectric layer 318 may be formed over the third metal material 316. As also illustrated in FIG. 3, a total thickness of the first and second metal materials 312, 314 is defined as 'T1'. In at least some existing metal gate line-cut processes, the thickness of the first and second metal materials 312, 314 can lead to processing challenges. For example, FIG. 3 further shows a metal gate cut region 320, where the metal layers of the gate structure 308 are disconnected, and which may be formed as part of a metal gate line-cut process as described above. In various cases, at a subsequent processing step, a dielectric layer may be formed within the metal gate cut region 320. Of particular note, the first and second metal materials 312, 314 may have a substantially uniform thickness T1 extending from the fin-elements 304 to the cut region 320. Before the cut region 320 is formed, in some cases, the first and second metal materials 312, 314 may have a substantially uniform thickness T1 extending through the cut region 320 as well, and which may be removed during a line-cut process. In some cases, due at least in part to the thickness T1 of the first and second metal materials 312, 314 at the cut region 320, at least some existing processes may require significant over etching of the metal layers within the cut region 320, during the metal gate line-cut process to fully remove the metal layers disposed therein. As a result of such over etching, there may be significant loss (e.g., etching) of a nearby dielectric layer (e.g., the dielectric layer 318, or other interlayer dielectric). Thus, it would be desirable to reduce such dielectric loss during the metal gate line-cut process.

Referring now to FIG. 4, illustrated therein is a cross-section view of a FinFET structure 400, along a plane substantially parallel to a plane defined by section AA' of FIG. 1, in which a metal gate line-cut process is performed, in accordance with various embodiments of the present disclosure. Generally, embodiments of the present disclosure may provide a metal gate layer, or multiple layers, having different thicknesses on a fin-element of a FinFET as compared to a neighboring line-cut region. Additionally, some embodiments provide a sacrificial metal portion may be used to prevent lateral etching during a metal line cut process. The FinFET structure 400 may include one or more of the features described above with reference to the FIGS. 1 and 3 such as fin elements 404 extending from a substrate, isolation regions 406, and a gate structure 408 disposed on and around the fin-elements 404. The gate structure 408 may include a gate stack having a dielectric layer 410, including an interfacial layer and a gate dielectric layer, and a metal layer formed over the dielectric layer 410. As described above, the metal layer may include a first metal material 412 (e.g., a PWFM), a second metal material 414 (e.g., an NWFM), and a third metal material 416 (e.g., such as tungsten). In various examples, a dielectric layer 418 may be formed over the third metal material 416. FIG. 4 also shows a metal gate cut region 420, which may be formed as part of a metal gate line-cut process as described above, and within which a dielectric layer may be formed during a subsequent stage of processing.

Contrary to at least some existing process (e.g., FIG. 3), and in some embodiments, the first and second metal materials 412, 414 may not have a substantially uniform thickness T1 extending from the fin-elements 404 to the cut region 420. Rather, in some embodiments, the first and second metal materials 412, 414 may have a total thickness 'T1' over the fin-elements 404, as shown in FIG. 4, while having a second thickness 'T2' less than T1 at the neighboring cut region 420. In some embodiments, the metal gate cut process used to form the cut region 420 may be performed prior to deposition of the second metal material 414. In some embodiments, the thickness T2 corresponds to the thickness of solely the first metal material 412 (e.g., the PWFM). Therefore, in some cases, before the cut region 420 is formed, the second metal material 414 may not be deposited at the cut region 420. As such, in some embodiments, the first metal material having thickness T2, and not the first and second metal materials having thickness T1, may be removed during a line-cut process. In some embodiments, due to the thinner T2 (e.g., as compared to T1) of solely the first metal material 412 at the cut region 420, embodiments of the present disclosure may not require the significant over etching of the metal layers within the cut region 320, as is the case for at least some existing processes. Thus, loss (e.g., via etching) of a nearby dielectric layer (e.g., the dielectric layer 318, or other interlayer dielectric) can be avoided. Moreover, in some embodiments, the third metal material 416 may include a material such as tungsten (W), which may be used as a lateral etch stop material. Thus, lateral etching of the nearby dielectric layer may be further mitigated by the lateral etch stopping functionality of the third metal material 416. In some cases, the third metal material 416 is a sacrificial layer which is removed at a subsequent processing step.

Figure 5:
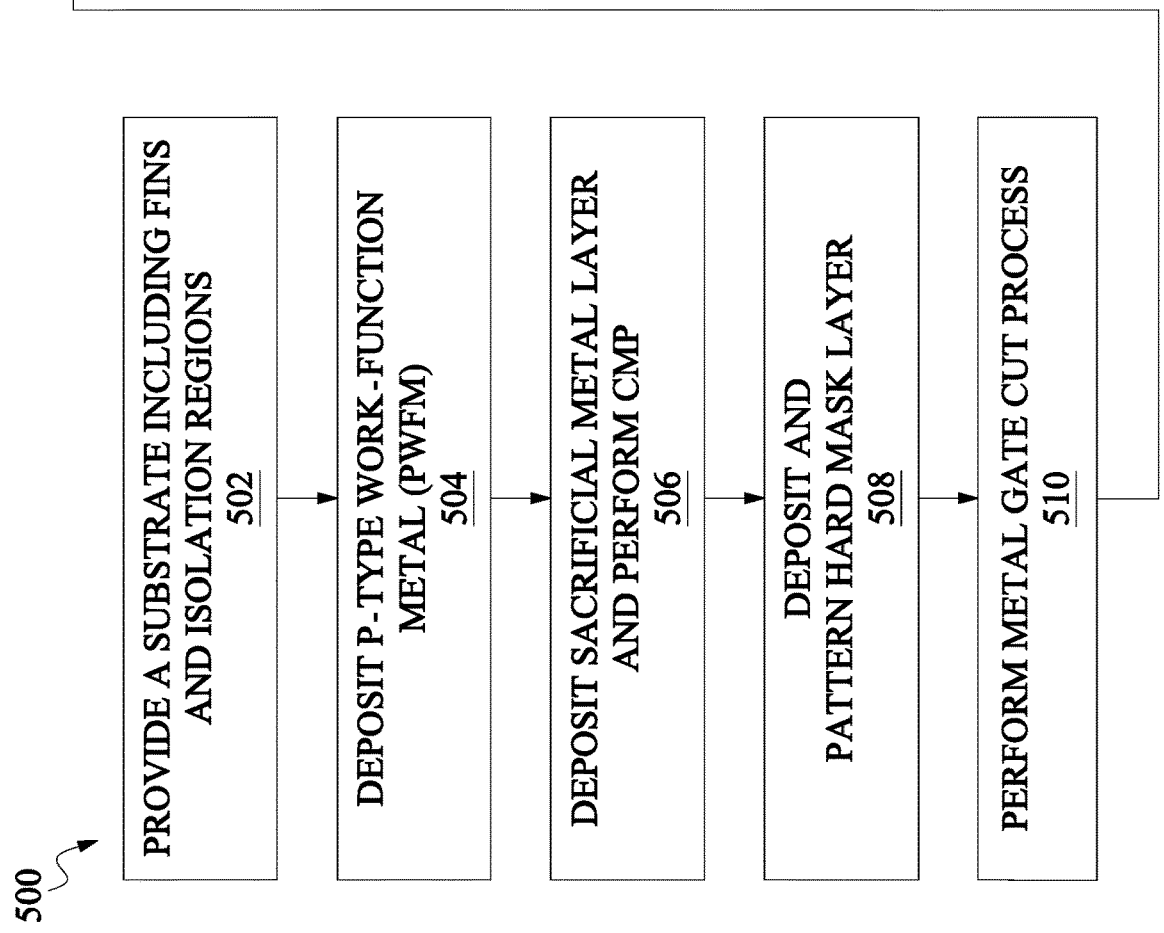
FIG. 5 is a flow chart of a semiconductor manufacturing method, according to one or more aspects of the present disclosure.

With reference now to FIG. 5, shown therein is a flow chart of a semiconductor manufacturing method 500, according to at least some embodiments. Additional steps may also be provided before, during, and after the method 500, and some steps described can be replaced, eliminated, or moved before or after other steps for additional embodiments of the method. It is also noted that the method 500 is exemplary, and is not intended to limit the present disclosure beyond what is explicitly recited in the claims that follow. The method 500 will be further described below in conjunction with FIGS. 6A, 6B, 7A, 7B, 8A, 8B, 9A, 9B, 10A, 10B, 11A, 11B, and 12A, 12B. FIGS. 6A, 7A, 8A, 9A, 10A, 11A, and 12A show cross-section views of a FinFET structure 600 along a plane substantially parallel to a plane defined by section CC' of FIG. 1, and FIGS. 6B, 7B, 8B, 9B, 10B, 11B, and 12B show cross-section views of the structure 600 along a plane substantially parallel to a plane defined by section AA' of FIG. 1.

In various embodiments, the method 500 begins at block 502 where a substrate including fins and isolation regions is provided. With reference to the example of FIGS. 6A and 6B, and in an embodiment of block 502, the structure 600 is shown. The FinFET structure 600 may include one or more of the features described above with reference to the FIG. 1 such as fin elements 604 extending from a substrate, isolation regions 606, and a gate structure 608 disposed on and around the fin-elements 604. In some embodiments, the fin-elements 604 may be formed as described above. A gate structure 608 may include a gate stack having a dielectric layer (e.g., including an interfacial layer and a gate dielectric layer), and a metal layer formed over the dielectric layer.

The method 500 proceeds to block 504 where a first work function metal layer is deposited. In some embodiments, the first work function metal layer includes a PWFM. Still referring to the example of FIGS. 6A and 6B, and in an embodiment of block 504, a metal layer including a PWFM layer 610 is formed over and around the fin-elements 604. Merely by way of example, the PWFM layer 610 may include Ni, Pd, Pt, Be, Ir, Te, Re, Ru, Rh, W, Mo, WN, RuN, MoN, TiN, TaN, WC, TaC, TiC, TiAlN, TaAlN, or combinations thereof. In various embodiments, the PWFM layer 610 may be formed using PVD, CVD, electron beam (e-beam) evaporation, and/or other suitable process.

Figure 6B:
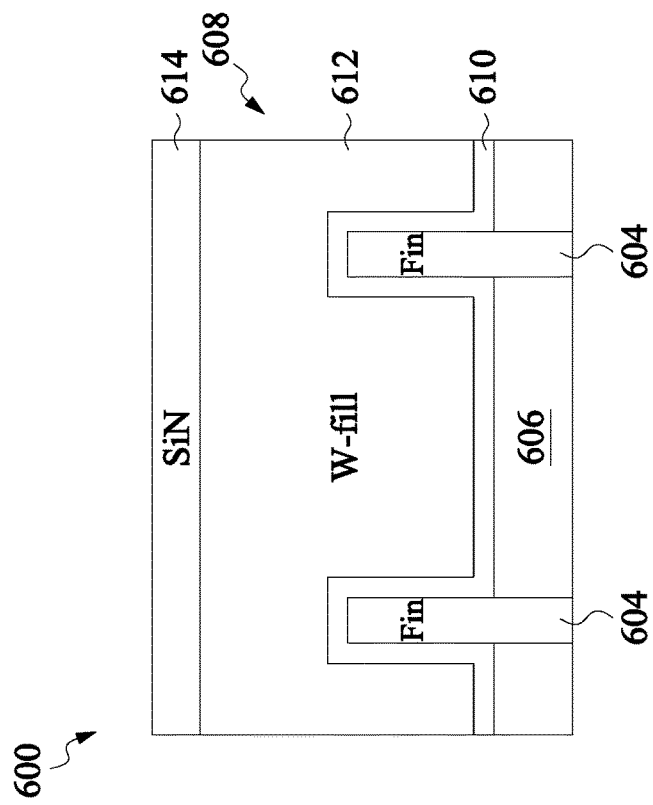
FIGS. 6B, 7B, 8B, 9B, 10B, 11B, and 12B show cross-section views of the FinFET structure along a plane substantially parallel to a plane defined by section AA' of FIG. 1, and fabricated according to the method of FIG. 5.
Figure 6A:
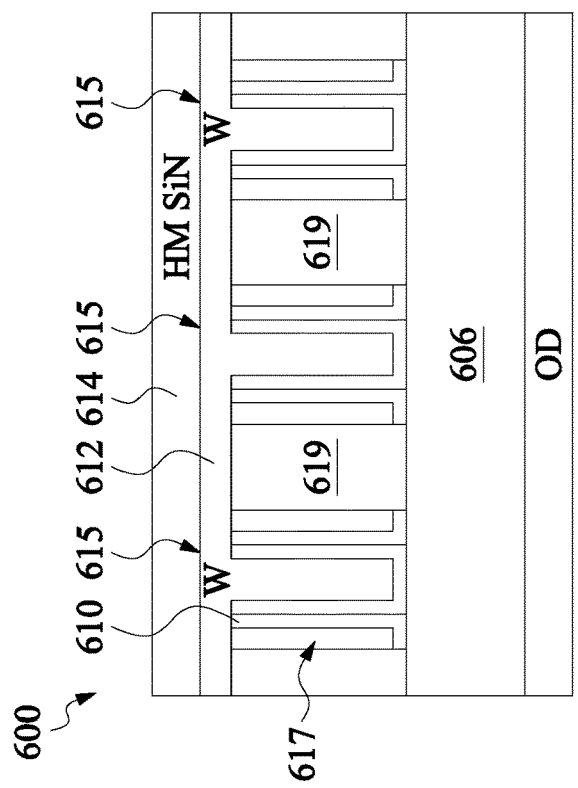
FIGS. 6A, 7A, 8A, 9A, 10A, 11A, and 12A show cross-section views of a FinFET structure along a plane substantially parallel to a plane defined by section CC' of FIG. 1, and fabricated according to the method of FIG. 5.
Figure 7B:
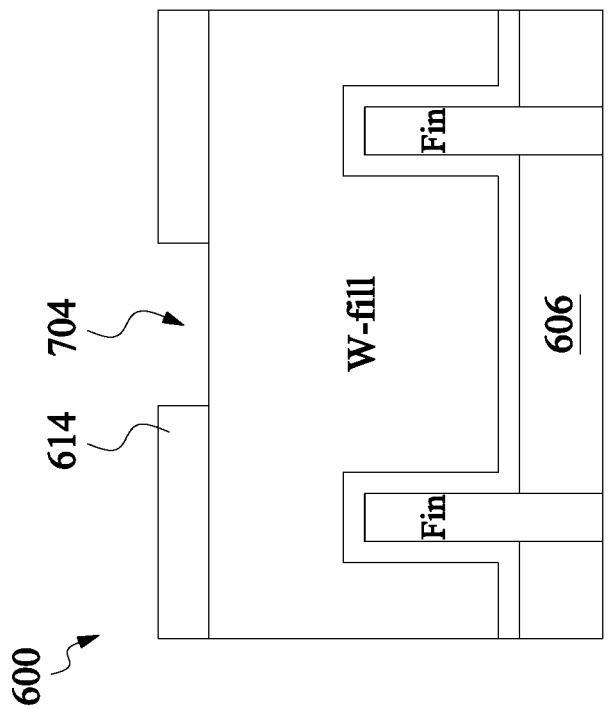
Figure 7A:
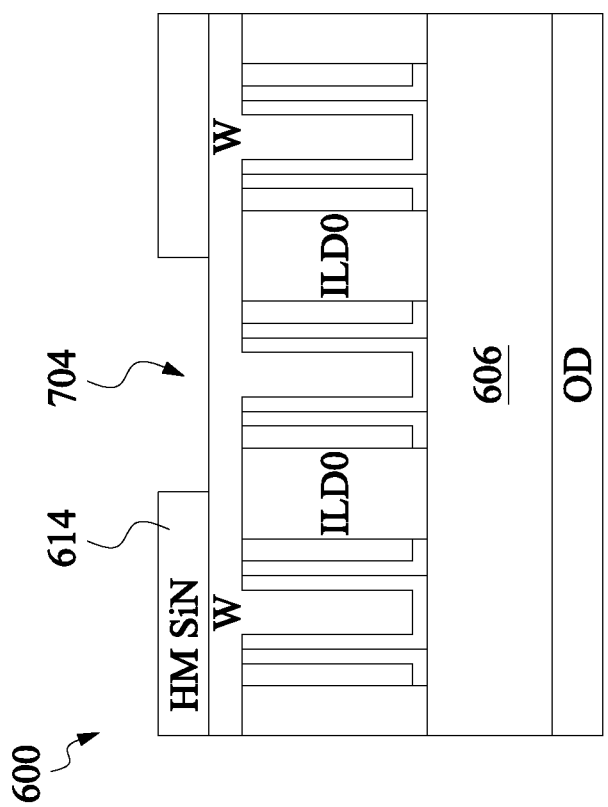

Thereafter, the method 500 proceeds to block 506 where a sacrificial metal layer is deposited and a chemical mechanical polishing (CMP) process is performed. In some embodiments, the sacrificial metal layer includes a tungsten (W) layer. In accordance with various embodiments, the sacrificial metal layer serves to mitigate lateral etching during a subsequent metal gate cut process, as described above. As shown in the example of FIGS. 6A and 6B, and in an embodiment of block 506, a sacrificial metal layer 612 is formed and a CMP process is performed to planarize a top surface of the sacrificial metal layer 612. FIGS. 6A and 6B also illustrate a plurality of gate stacks 615, which may have one or more sidewall spacer layers 617 formed on sidewalls of the gate stacks 615. The sidewall spacers may include a dielectric material such as silicon oxide, silicon nitride, silicon carbide, silicon oxynitride, or combinations thereof. Moreover, in various embodiments, a dielectric layer 619 may be interposed between each of the plurality of gate stacks 615. In at least some embodiments, the sacrificial metal layer 612 may serve to protect the dielectric layer 619 during a subsequent metal gate cut process.

The method 500 proceeds to block 508 where a hard mask layer is deposited and patterned. In some embodiments, the hard mask layer may include a patterned photoresist layer. Alternatively, in some embodiments, the hard mask layer may include a patterned dielectric layer such as silicon nitride, silicon oxynitride, silicon carbide, or other suitable material. With reference to the example of FIGS. 6A and 6B, a hard mask layer 614 is deposited. With reference to the example of FIGS. 7A and 7B, the hard mask layer 614 is patterned. In some embodiments, the patterned hard mask layer 614 includes an opening 704 that defines a metal gate line-cut to be performed later. For example, in some cases, the opening 704 may correspond to a metal gate cut pattern, similar to the metal gate cut pattern 210 of FIG. 2. In various embodiments, a portion of the structure 600 over one of the gate stacks 615 is exposed within the opening 704. In some embodiments, the opening 704 has a larger width than a distance between adjacent sidewall spacers of the exposed gate stack 615. In some cases, this relaxes lithography process resolution constrains for the metal gate line-cut process.

Figure 8B:
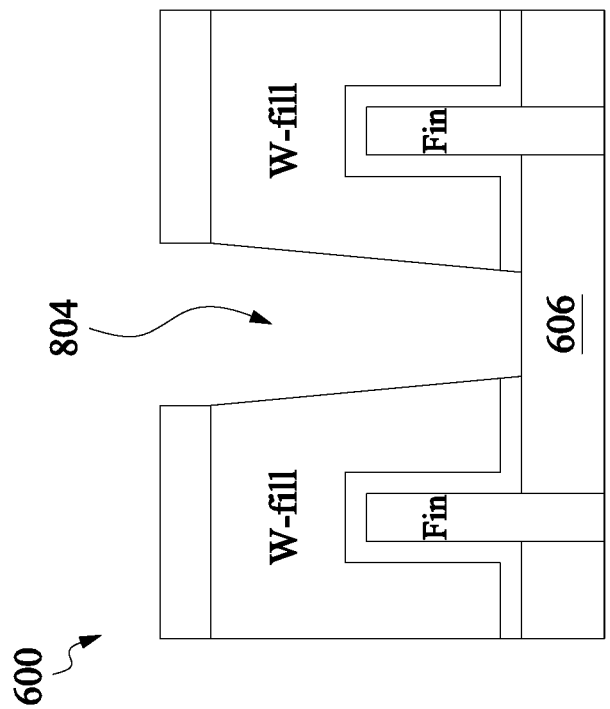
Figure 8A:
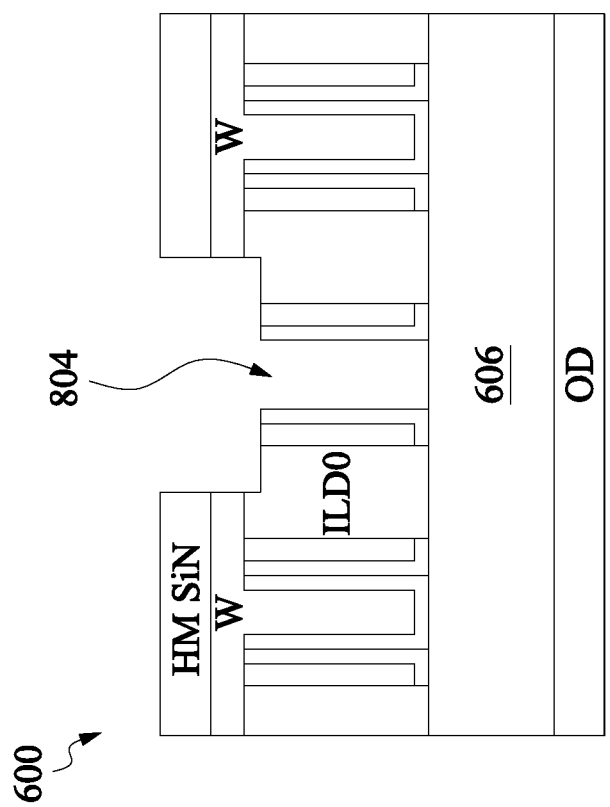
Figures 9A, 9B:
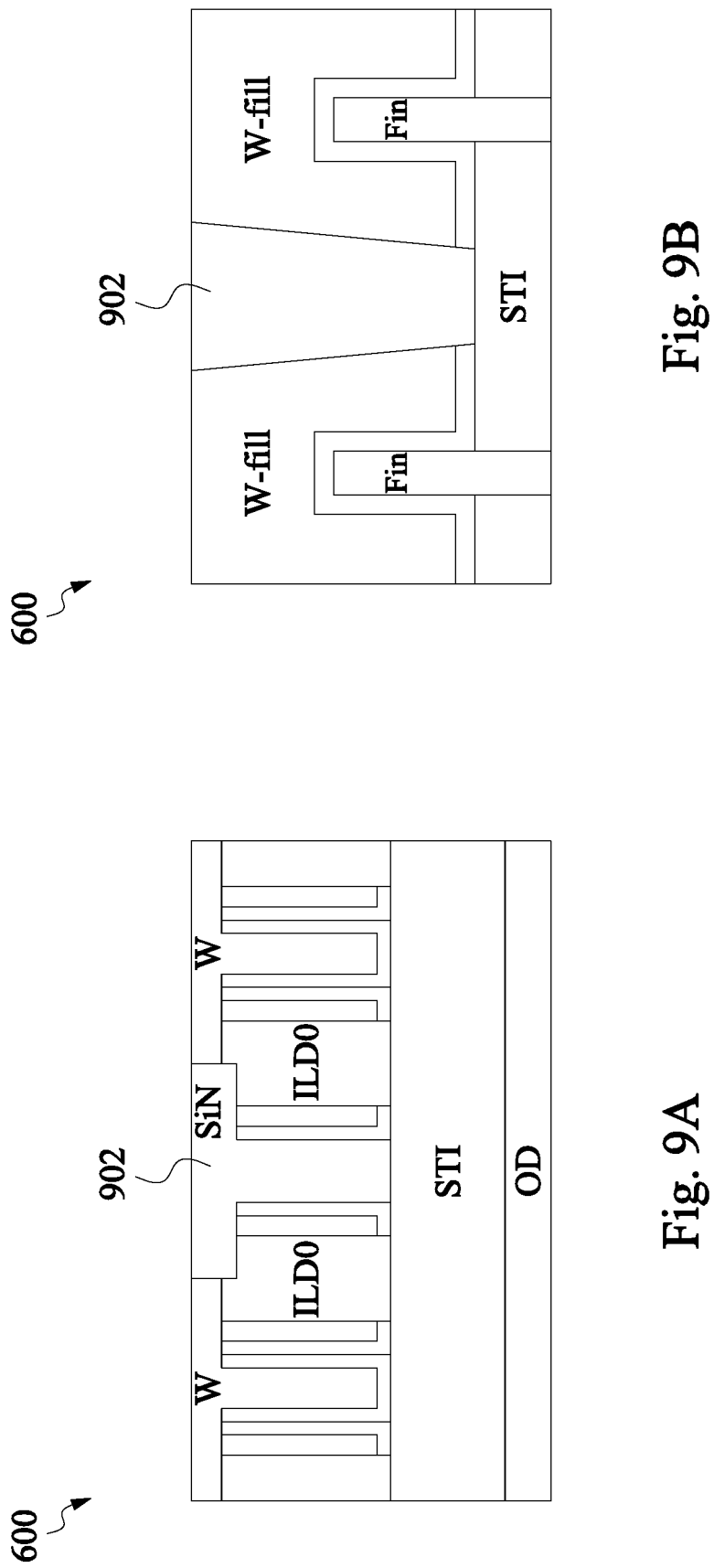

The method 500 proceeds to block 510 where a metal gate line-cut process is performed. With reference to the example of FIGS. 8A and 8B, and in an embodiment of block 510, a metal gate line-cut process is performed. As shown in FIGS. 8A and 8B, the line-cut process may be used to remove exposed portions of the sacrificial metal layer 612, including the PWFM layer 610 thereunder, through the opening 704 to form a line-cut 804. In some embodiments, the line-cut 804 extends to the isolation regions 606 and effectively separates conductive gate metal layers in adjacent gate stacks from one another. By way of example, an etch process used to perform the metal gate line-cut process of block 510 may include a wet etch, a dry etch, and/or a combination thereof. In some embodiments, the etch process is chosen to selectively etch the sacrificial metal layer 612 and the PWFM layer 610 without substantially etching the sidewall spacers 617 and the dielectric layer 619. As described above, due to the thinner T2 (e.g., as compared to T1) of solely the PWFM layer 610 within the cut region, embodiments of the present disclosure may not require the significant over etching of the metal layers within the cut region, as is the case for at least some existing processes. Thus, loss (e.g., via etching) of a nearby dielectric layer (e.g., the dielectric layer 619) can be avoided. In some embodiments, after forming the line-cut 804, the patterned hard mask layer 614 may be removed by an etch process. In some cases, where the patterned hard mask layer 614 is a patterned photoresist layer, the patterned hard mask layer 614 may be removed by wet stripping and/or plasma ashing.

The method 500 proceeds to block 512 where a dielectric layer is deposited and a CMP process is performed. With reference to the example of FIGS. 9A and 9B, and in an embodiment of block 512, a dielectric layer 902 may be deposited and a CMP process is performed to planarize a top surface of the dielectric layer 902. In some embodiments, the dielectric layer 902 may include silicon oxide, silicon nitride, oxynitride, and/or other suitable dielectric material layer. Thus, in various embodiments, the dielectric layer 902 may further serve to electrically isolate gate metal lines of neighboring gate stacks.

Figure 10B:
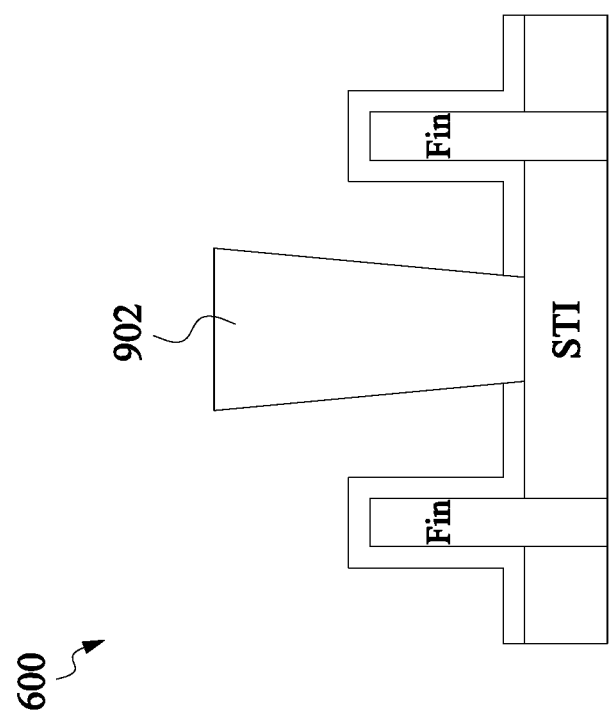
Figure 10A:
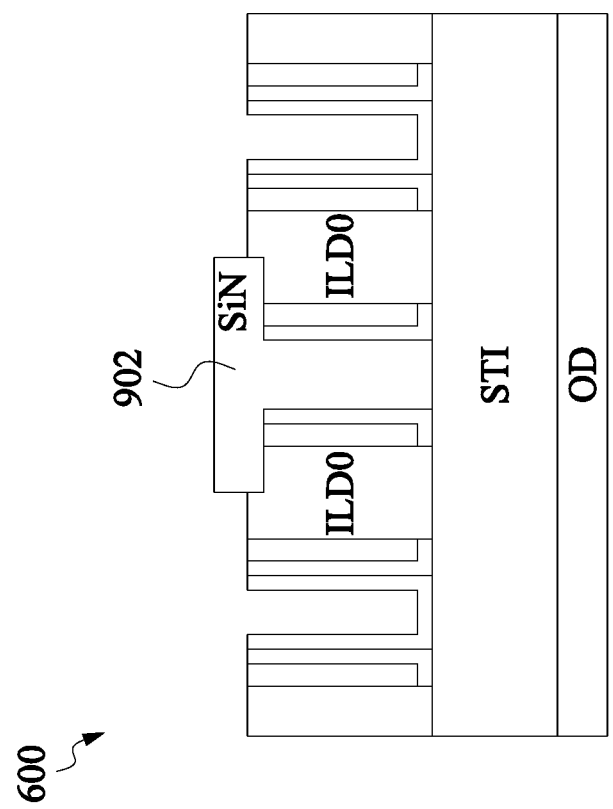
Figure 11B:
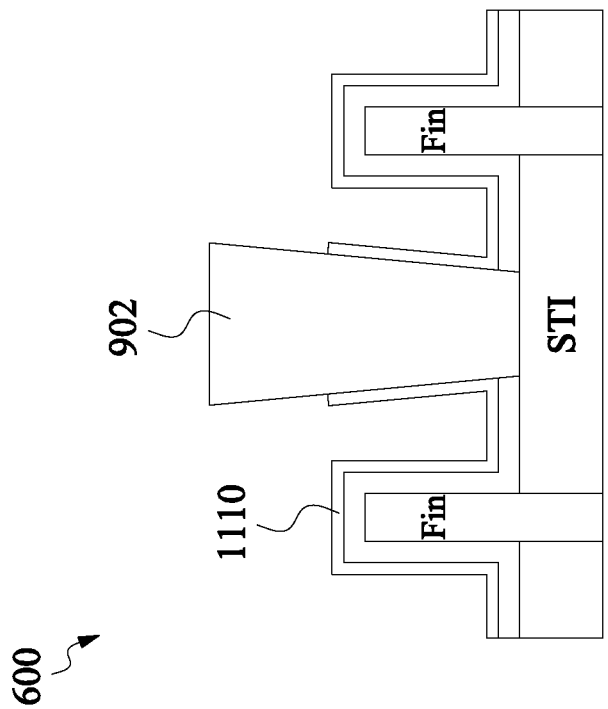
Figure 11A:
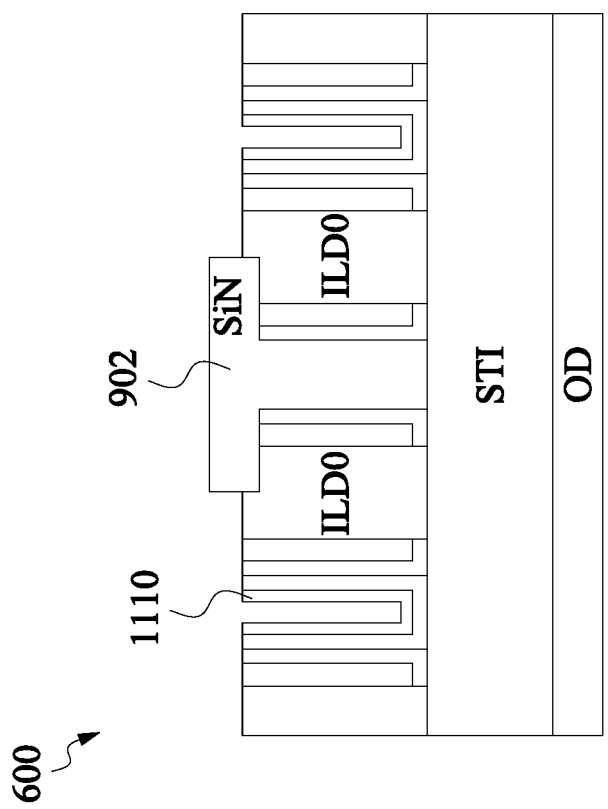
Figures 12A, 12B:
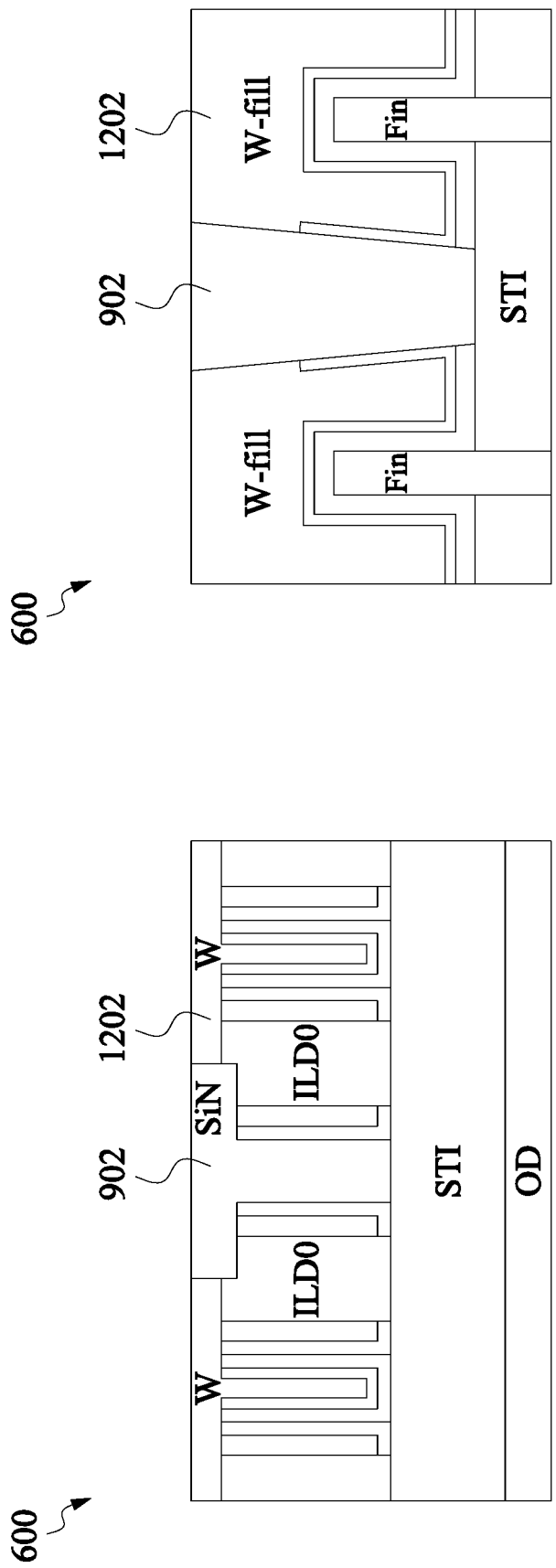

In various cases, the method 500 then proceeds to block 514 where the sacrificial metal layer 612 is removed, as shown in the example of FIGS. 10A and 10B. In various embodiments, the sacrificial metal layer 612 may be removed by a wet etch, a dry etch, or a combination thereof. After removal of the sacrificial metal layer 612, the method 500 proceeds to block 516 where a second work function metal layer is deposited. In some embodiments, the second work function metal layer includes an NWFM. Referring to the example of FIGS. 11A and 11B, and in an embodiment of block 516, a metal layer including a NWFM layer 1110 is formed over the structure 600. Merely by way of example, the NWFM layer 1110 may include Ni, Pd, Pt, Be, Ir, Te, Re, Ru, Rh, W, Mo, WN, RuN, MoN, TiN, TaN, WC, TaC, TiC, TiAlN, TaAlN, or combinations thereof. In various embodiments, the NWFM layer 1110 may be formed using PVD, CVD, electron beam (e-beam) evaporation, and/or other suitable process. In some embodiments, an etch-back process may be performed after formation of the NWFM layer 1110.

In some embodiments, after forming the NWFM layer 1110, a glue layer may be deposited over the NWFM layer 1110. In some embodiments, an etch-back process may be performed after formation of the glue layer. The method 500 then proceeds to block 518 where a metal layer is deposited and a CMP process is performed. With reference to the example of FIGS. 12A and 12B, and in an embodiment of block 518, a metal layer 1202 is formed and a CMP process is performed to planarize a top surface of the metal layer 1202. In some embodiments, the metal layer 1202 includes a tungsten (W) layer. Alternatively, in some embodiments, the metal layer 1202 may include other metals such as Ni, Pd, Pt, Be, Ir, Te, Re, Ru, Rh, W, Mo, WN, RuN, MoN, TiN, TaN, WC, TaC, TiC, TiAlN, TaAlN, or combinations thereof. In embodiments including the glue layer deposited over the NWFM layer 1110, the metal layer 1202 may be deposited on the glue layer.

The FinFET structure 600 may undergo further processing to form various features and regions known in the art. For example, subsequent processing may form various contacts/vias/lines and multilayers interconnect features (e.g., metal layers and interlayer dielectrics) on the substrate, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

The various embodiments described herein offer several advantages over the existing art. It will be understood that not all advantages have been necessarily discussed herein, no particular advantage is required for all embodiments, and other embodiments may offer different advantages. For example, embodiments discussed herein include a metal gate cut process and related structure are provided. At least some embodiments of the present disclosure may be used to reduce inter-layer dielectric (ILD) loss during a metal gate cut process. For example, in at least some existing processes, over-etching of a metal gate layer (e.g., during a metal gate cut process) may lead to such undesirable ILD loss. To mitigate this issue, embodiments of the present disclosure provide a metal gate layer, or multiple layers, having different thicknesses on a fin (e.g., FinFET) and on a neighboring line-cut region. Moreover, in at least some embodiments, a sacrificial metal portion may be used to prevent lateral etching during a metal line cut process, thereby effectively preventing ILD loss. Thus, embodiments of the present disclosure serve to overcome various shortcomings of at least some current resist compositions and methods.

Thus, one of the embodiments of the present disclosure described a method that includes forming a first fin and a second fin on a substrate. In various embodiments, the first fin has a first gate region and the second fin has a second gate region. By way of example, a metal-gate line is formed over the first and second gate regions. In some embodiments, the metal-gate line extends from the first fin to the second fin, and the metal-gate line includes a sacrificial metal portion. In various examples, a line-cut process is performed to separate the metal-gate line into a first metal gate line and a second gate line. In some embodiments, the sacrificial metal portion prevents lateral etching of a dielectric layer during the line-cut process.

In another of the embodiments, discussed is a method that includes forming a plurality of fin elements extending from a substrate. In various embodiments, each of the plurality of fin elements includes a gate region, and a dielectric layer is disposed between each adjacent gate region. In some cases, a first work function metal layer is deposited over the gate region of each of the plurality of fin elements. Thereafter, in some embodiments, a sacrificial metal layer is formed over the first work function metal layer. In some embodiments, after forming the sacrificial metal layer, a cut region is defined using a patterned hard mask layer, where the patterned hard mask layer includes an opening corresponding to the defined cut region. In various examples, an etching process is then performed, through the opening in the patterned hard mask layer, to remove the sacrificial metal layer and the first work function metal layer. In some embodiments, the sacrificial metal layer prevents removal of the dielectric layer during the performing the etching process.

In yet another of the embodiments, discussed is a semiconductor device that includes a first fin and a second fin extending from a substrate, the first fin having a first gate region and the second fin having a second gate region. In some embodiments, the device also includes a first metal layer disposed over the first gate region and along a first sidewall of a first side of a dielectric layer, where the dielectric layer is formed within a line-cut region. In addition, the device may include a second metal layer disposed over the second gate region and along a second sidewall opposite the first sidewall of a second side of the dielectric layer. In various embodiments, the first metal layer has a first thickness over the first gate region, and the first metal layer has a second thickness along the first sidewall of the first side of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first fin extending from a substrate, the first fin having a first gate region; and
    a first metal layer disposed over the first gate region and along a first sidewall of a first side of a dielectric layer, wherein the first metal layer includes a plurality of work-function metal layers over the first gate region and one of the plurality of work-function metal layers along the first sidewall of the dielectric layer, and wherein the dielectric layer is formed within a line-cut region;
    wherein the first metal layer has a first thickness over the first gate region, wherein the first metal layer has a second thickness along the first sidewall of the first side of the dielectric layer, and wherein the first thickness is different than the second thickness.

2. The semiconductor device of claim 1, wherein the second thickness is less than the first thickness.

3. The semiconductor device of claim 1, further comprising:
    a second fin extending from a substrate, the second fin having a second gate region; and
    a second metal layer disposed over the second gate region and along a second sidewall opposite the first sidewall of a second side of the dielectric layer;
    wherein the second metal layer has a third thickness over the second gate region, and wherein the second metal layer has a fourth thickness along the second sidewall of the second side of the dielectric layer.

4. The semiconductor device of claim 3, wherein the fourth thickness is less than the third thickness.

5. The semiconductor device of claim 4, wherein the first thickness is substantially the same as the third thickness, and wherein the second thickness is substantially the same as the fourth thickness.

6. The semiconductor device of claim 1, wherein the plurality of work-function metal layers includes both a P-type work-function metal (PWFM) and an N-type work-function metal (NWFM), and wherein the one of the plurality of work-function metal layers includes the N-type work-function metal (NWFM).

7. The semiconductor device of claim 3, wherein the second metal layer includes both a P-type work-function metal (PWFM) and an N-type work-function metal (NWFM) over the second gate region, and wherein the second metal layer includes the N-type work-function metal (NWFM) deposited at the second sidewall of the dielectric layer.

8. The semiconductor device of claim 3, wherein the first metal layer is disposed on less than an entire portion of the first sidewall, and wherein the second metal layer is disposed on less than an entire portion of the second sidewall.

9. The semiconductor device of claim 1, further comprising:
    a glue layer formed over the first metal layer; and
    another metal layer formed over the glue layer.

10. The semiconductor device of claim 9, wherein the another metal layer includes a tungsten layer.

11. The semiconductor device of claim 1, wherein the dielectric layer includes a nitride layer.

12. The semiconductor device of claim 3, wherein the dielectric layer electrically isolates the first metal layer from the second metal layer.

13. The semiconductor device of claim 3, wherein first metal layer is continuous from the first gate region to the first sidewall, and wherein the second metal layer is continuous from the second gate region to the second sidewall.

14. A semiconductor device, comprising:
    a first fin and a second fin extending from a substrate, the first fin having a first gate region and the second fin having a second gate region;
    a first metal layer disposed over the first gate region and along a first sidewall of a first side of a dielectric layer, wherein the first metal layer includes a first plurality of work-function metal layers over the first gate region and one of the first plurality of work-function metal layers along the first sidewall of the dielectric layer, wherein the dielectric layer is formed within a line-cut region, and wherein the first metal layer directly contacts the first side of the dielectric layer; and
    a second metal layer disposed over the second gate region and along a second sidewall opposite the first sidewall of a second side of the dielectric layer, wherein the second metal layer includes a second plurality of work-function metal layers over the second gate region and one of the second plurality of work-function metal layers along the second sidewall of the dielectric layer, and wherein the second metal layer directly contacts the second side of the dielectric layer;
    wherein the first metal layer has a first thickness over the first gate region, and wherein the first metal layer has a second thickness along the first sidewall of the first side of the dielectric layer.

15. The semiconductor device of claim 14, wherein the second metal layer has the first thickness over the second gate region, and wherein the second metal layer has the second thickness along the second sidewall of the second side of the dielectric layer.

16. The semiconductor device of claim 15, wherein the second thickness is less than the first thickness.

17. The semiconductor device of claim 14, wherein the first plurality of work-function metal layers and the second plurality of work-function metal layers include both a P-type work-function metal (PWFM) and an N-type work-function metal (NWFM), and wherein the one of the first plurality of work-function metal layers and the one of the second plurality of work-function metal layers include the N-type work-function metal (NWFM).

18. A semiconductor device, comprising:
    a line-cut region including a dielectric layer; and
    a first FinFET structure disposed on a first side of the dielectric layer; and
    a first metal layer disposed over the first FinFET structure and along a first sidewall of the first side of a dielectric layer, wherein first metal layer is continuous from the first FinFET structure to the first sidewall, and wherein the first metal layer includes a plurality of work-function metal layers over the first FinFET structure and one of the plurality of work-function metal layers along the first sidewall of the dielectric layer;

wherein the first metal layer has a first thickness over the first FinFET structure, wherein the first metal layer has a second thickness along the first sidewall, and wherein the second thickness is less than the first thickness.

19. The semiconductor device of claim 18, further comprising:
   a second FinFET structure disposed on a second side of the dielectric layer opposite the first side; and
   a second metal layer disposed over the second FinFET structure and along a second sidewall of the second side of a dielectric layer, wherein second metal layer is continuous from the second FinFET structure to the second sidewall, and wherein the second metal layer includes the plurality of work-function metal layers over the second FinFET structure and the one of the plurality of work-function metal layers along the second sidewall of the dielectric layer;
   wherein the second metal layer has the first thickness over the second FinFET structure, and wherein the second metal layer has the second thickness along the second sidewall.

20. The semiconductor device of claim 19, wherein the plurality of work-function metal layers includes both a P-type work-function metal (PWFM) and an N-type work-function metal (NWFM), and wherein the one of the plurality of work-function metal layers includes the N-type work-function metal (NWFM).

* * * * *